United States Patent
Chao et al.

(10) Patent No.: US 6,483,187 B1
(45) Date of Patent: Nov. 19, 2002

(54) HEAT-SPREAD SUBSTRATE

(75) Inventors: Shin-Hua Chao, Kaohsiung (TW); Kuan-Neng Liao, Kaohsiung (TW); Yao-Hsin Feng, Hualien (TW); Hou-Chang Kuo, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 09/638,262

(22) Filed: Aug. 11, 2000

(51) Int. Cl.$^7$ ................................................ H01L 23/34
(52) U.S. Cl. ........................ 257/712; 257/706; 257/707; 257/774; 257/778
(58) Field of Search .......................... 257/712, 706–708, 257/737, 738, 774, 778, 780, 784, 787, 684

(56) References Cited

U.S. PATENT DOCUMENTS

| | | | |
|---|---|---|---|
| 5,404,047 A | * 4/1995 | Rostoker et al. | 257/786 |
| 5,502,337 A | * 3/1996 | Nozaki | 257/773 |
| 5,844,168 A | * 12/1998 | Schueller et al. | 174/52.4 |
| 6,020,637 A | 2/2000 | Karnezos | 257/738 |
| 6,034,427 A | * 3/2000 | Lan et al. | 257/698 |
| 6,057,601 A | * 5/2000 | Lau et al. | 257/738 |
| 6,160,705 A | * 12/2000 | Stearns et al. | 361/704 |

FOREIGN PATENT DOCUMENTS

JP     11176993 A  * 7/1999

* cited by examiner

Primary Examiner—Eddie Lee
Assistant Examiner—Chris C. Chu
(74) Attorney, Agent, or Firm—J.C. Patents

(57) ABSTRACT

A heat-spread substrate consisting of a metal heat spreader and a substrate is disclosed. The metal heat spreader has a surface with a cavity, which is adapted for supporting a die. Such surface further includes a ground ring arranged at the periphery of the cavity; a substrate-supporting surface surrounding the periphery of the ground ring; a plurality of first ground pads arranged at the periphery of the substrate-supporting surface; and a plurality of second ground pads arranged on the substrate-supporting surface and protruding it. The substrate is provided on the substrate-supporting surface having a plurality of through holes. The through holes corresponds to the first ground pad so as to make it be located therein, respectively. The substrate further includes a plurality of mounting pads and a plurality of ball pads, in which the mounting pads are close to the cavity, and the first ground pad, the second ground pads and the ball pads are formed in the form of ball grid array and are coplanar roughly.

18 Claims, 5 Drawing Sheets

HEAT-SPREAD SUBSTRATE

BACKGROUND OF THE INVENTION

1. Field of the Invention

The present invention relates to a structure of a heat-spread substrate. More specifically, the present invention relates to a structure of heat-spread substrate in which a mounting ground pad is formed directly by a heat spreader.

2. Description of the Related Art

With the great improvement of the integrated circuit, the current semiconductor components have important features, such as multi-function, high integrity and high speed. Accordingly, for the sequent stage of package, many demand such as high density, high heat-spread performance and high reliability would be revealed. They are the important guides in development of the semiconductor package.

Referring to FIG. 1, a schematically cross sectional view of a conventional ball grid array type package with cavity down is shown. The structure of the ball grid array type package 100 with cavity down shown in the drawing is disclosed in U.S. Pat. No. 6,020,637. In the structure, the carrier is mainly consisted of a heat spreader 102, a ground plane 104, and a flex substrate 110. The heat spreader 102, the ground plane 104 and the flex substrate 110 are attached with insulating adhesives 106 and 108, respectively. The ground plane 104 and the flex substrate 110 form a cavity at the center. The flex substrate 110 is a usual flex tape interconnect substrate formed by laminating a patterned trace layer and a polyimnide layer. The patterned trace layer 112 on the top surface of the substrate has a mounting pad (or called as gold finger) and a ball pad. Moreover, the patterned trace layer 112 is covered by a solder mask 114. The die 120 has an active surface 120a and a back surface 120b. The die 120 is attached to the bottom of the cavity by applying an adhesive 124 on the back surface 120b. The ball pad 122 of the active surface 120a is connected to the ground ring 116 of the ground plane 104 and the mounting pad of the rigid substrate, respectively. The die 120, the gold wires 126, the mounting pad are encapsulated with a molding compound 128. Solder balls 130 are mounted on the surface of the ball pad 112. In the conventional ball grid array type package 100 with cavity down, the ground plane 104 is connected to the patterned trace layer 112 on the surface of the flex substrate 110 by a via 118. Then, the ground plane 104 is interconnected through solder balls 130. The via 118 is obtained by fill hole process. This would make the assembling complicated and adversely affect the bondability of the via 118 to the ground plane 104 to reduce the reliability of the product.

SUMMARY OF THE INVENTION

It is one object of the present invention to provide a heat spreader, in which a ground pad is directly provided on the heat spreader and solder balls are mounted so as to ensure the reliability of the joints where the heat spreader is grounded.

It is another object of the present invention to provide a heat spreader, in which a ground pad and a substrate-supporting surface are simultaneously formed by thickness decreasing process to simplify the fabricating process. Further, it also can ensure the coplanarity of solder balls to enhance the reliability of the product by thickness controlling to make the ground pad and the position of the solder balls locate in the substrate stand at the same level.

To achieve the above and other purposes, a heat-spread substrate consisting of a metal heat spreader and a substrate is provided. The metal heat spreader has a surface with a cavity, which is adapted for supporting a die. Such surface further includes a ground ring arranged at the periphery of the cavity; a substrate-supporting surface surrounding the periphery of the ground ring; a plurality of first ground pads arranged at the periphery of the substrate-supporting surface; and a plurality of second ground pads arranged on the substrate-supporting surface and protruding it. The substrate is provided on the substrate-supporting surface having a plurality of through holes. The through holes corresponds to the first ground pad so as to make it be located therein, respectively. The substrate further includes a plurality of mounting pads and ball pads, in which the mounting pads are close to the cavity. The first ground pads, the second ground pads and the ball pads are formed in the form of ball grid array and are coplanar roughly.

To achieve the above and other purposes according to the present invention, a fabricating process of the above heat-spread substrate is provided. The process comprises at least the steps as following. First a metal heat spreader is provided. A thickness decreasing process is carried out on one of the surfaces of the metal heat spreader to decrease the thickness of part of areas on the surface. A cavity, a ground ring, a substrate supporting surface, first ground pads and second ground pads mentioned above are formed on the surface. In this case, the cavity, the ground ring, the substrate-supporting surface, the first ground pads and the second ground pads have different decreasing thickness, respectively. A plating process is then carried out to form a plating layer on the surfaces of the first ground pads and the second ground pads, respectively. The substrate is attached on the substrate-supporting surface. As set forth above, the substrate has a plurality of through holes to make the first ground pads locate in the corresponding through holes, respectively. The substrate further includes a plurality of mounting pads and a plurality of ball pads. In the substrate, the mounting pads are close to the cavity. The first ground pads and the second ground pads and the ball pad are formed in the form of ball grid array and are coplanar roughly.

According to one of the preferred examples of the present invention, when the above heat-spread substrate is applied in package, the die is attached in the bottom of the cavity by the back surface thereof. The ball pads on the active surface of the die are connected to the ground ring and the mounting pads of the substrate by leads. The whole cavity and the parts connected to leads are encapsulated with the molding compound. Solder balls are mounted in the first ground pads, the second ground pads and the ball pads to form a structure of a ball grid array type package. In the present invention, the substrate can be a rigid substrate or a flex substrate. A plating layer can be formed on the surfaces of the first ground pads, the second ground pads and the ball pads to improve the bondability of the solder ball to them.

In the process according to the present invention, a black oxidation can be further carried out after plating process to oxidize the substrate-supporting surface to improve the bondability of the substrate to the metal heat spreader. The thickness decreasing process includes stamping. Alternatively, it can be accomplished by multi-photography.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DETAILED DESCRIPTION OF THE PREFERRED EMBODIMENTS

Referring to FIGS. 2 to 6, a schematic cross sectional view of a fabricating process of a heat-spread type ball grid array package according to one of the preferred embodiments of the present invention is illustrated. A thermal enhanced BGA according to the present invention is formed on a heat-spread substrate and is a ball grid array type package with cavity down. Now, referring to FIG. 2, a heat-spread substrate according to the present invention is formed on a metal heat spreader 202. The metal heat spreader 202 includes highly conductive materials, such as copper.

Figure 1:
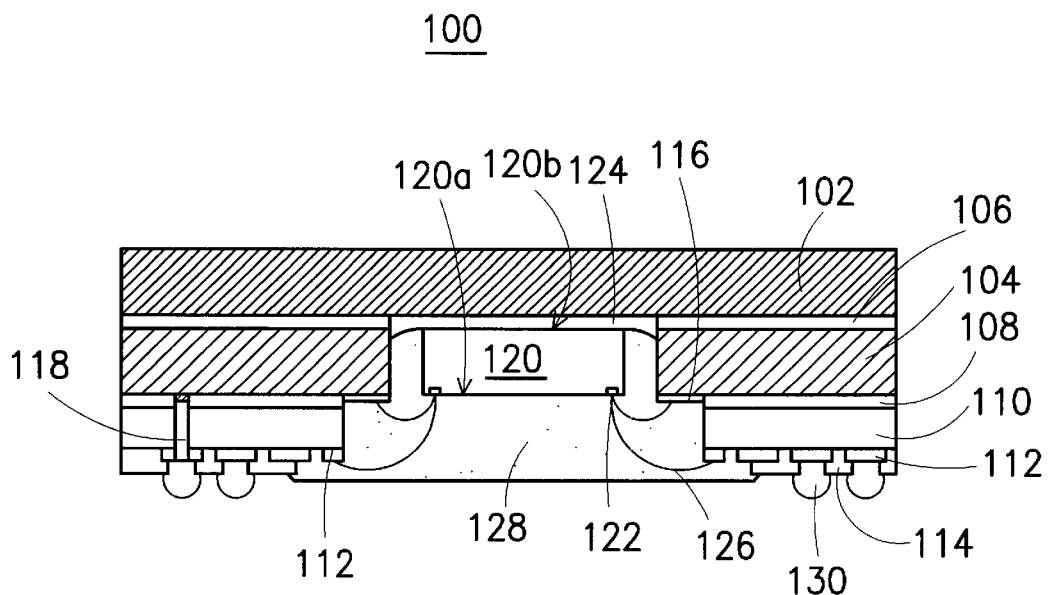
FIG. 1 is a schematically cross sectional view of a conventional ball grid array package with cavity down.
Figure 2:
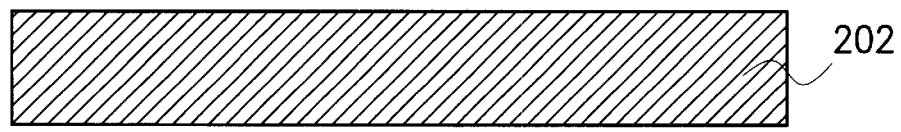
FIGS. 2 to 6 are schematically cross sectional views of a fabricating process of a heat-spread ball grid array type package according to one of the preferred embodiments of the present invention.
Figure 3:
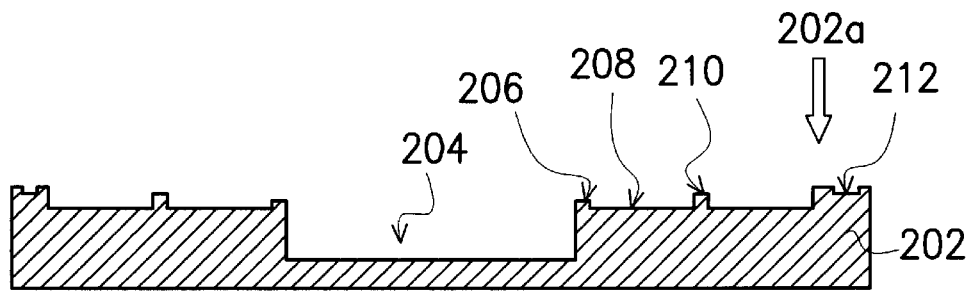
Figure 7:
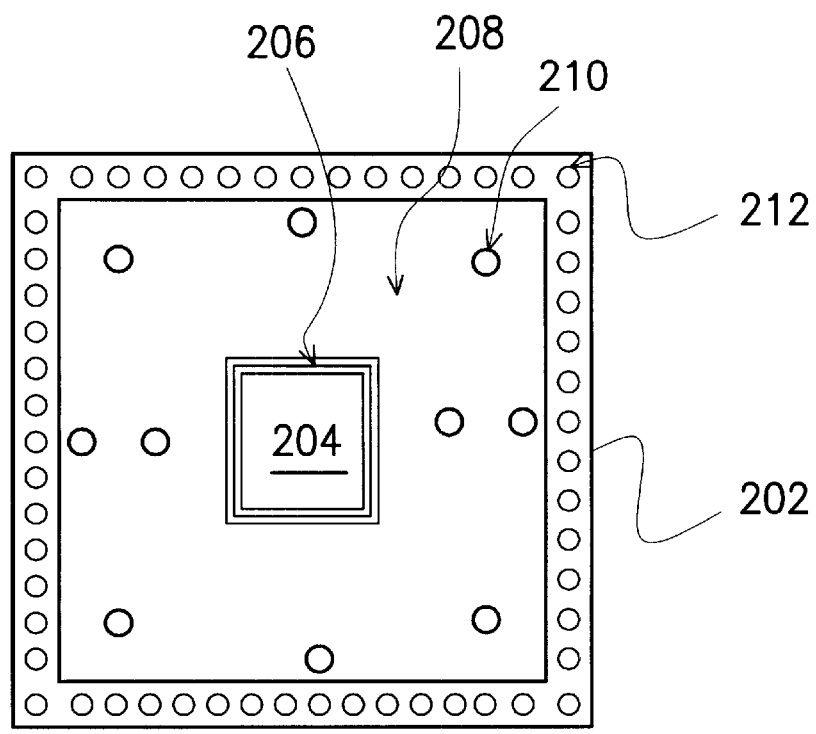
FIG. 7 is top view of FIG. 3.

Referring to FIGS. 3 and 7, a top view of FIG. 3 is shown. A thickness decreasing process is carried out to decrease the thickness of part of the area on the surface 202a of the metal heat spreader 202. Such thickness decreasing process can be accomplished by one or more stamping processes, or by multi-photolithography and half etching. By the thickness decreasing process, a cavity 204 is formed roughly at center on the surface 202a of the metal heat spreader 202 to accommodate the die. The cavity 204 has a ground ring 206 around itself. A substrate supporting surface 208 is provided at the periphery of the ground ring 206 for supporting the substrate. A ground pad 210 is provided on the top surface of the substrate-supporting surface 208, which protrudes the substrate-supporting surface 208. A ground pad 212 is provided at the periphery of the substrate-supporting surface 208. The ground pads 210 and 212 are the ground joints for the sequent metal heat spreaders 202. In such thickness decreasing process, the cavity 204, the ground ring 206, the substrate-supporting surface 208, and the ground pads 210 or 212 each has the correspondingly decreased thickness, although some of them are protruded.

Figure 4:
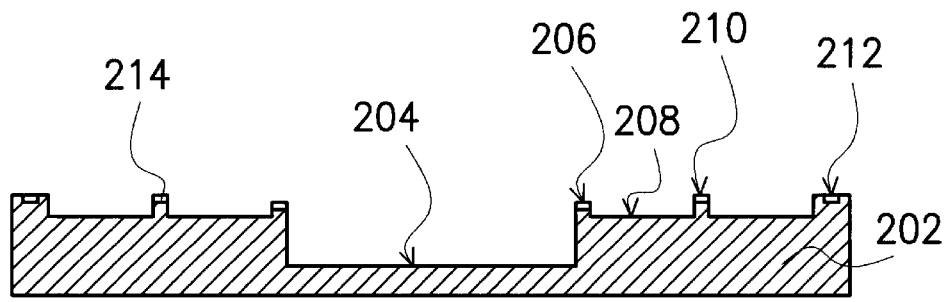

Referring to FIG. 4, a plating process is carried out. A plating layer 214 is formed mainly by plating the surfaces of the ground ring 206, the ground pads 210 and 212. A masking layer (not shown), such as photoresist, can be first formed on the surface 202a of the heat spreader 202 to expose only the surfaces of ground ring 206, the ground pads 210 and 212. Then, a plating process is carried out. Finally, the masking layer is removed. The plating layer 214 is used to improve the bondability of the ground ring to leads when sequent wire bonding is performed, and to enhanced the bondability of the ground pads 210 and 212 to solder balls. Therefore, the plating layer 214 can be formed by one or more layers of such as copper, nickel, palladium, silver, nickel palladium alloy. The top surface thereof is preferably formed of gold. FIG. 7 depicts a schematic top view of FIG. 4, showing the cavity 204, the ground ring 206 disposed adjacent to and surrounding the cavity 204. The substrate-supporting surface 208 disposed adjacent to, and surrounding the ground ring 206. A plurality of ground pads 210 and 212 disposed at the periphery of the cavity 204.

To improve the bondability of the sequent substrate attaching, a black oxidation can be carried out after the plating process to oxidize the substrate-supporting surface 208 to be a coarse surface. The black oxidation is usually performed by immersing the copper surface into an alkaline oxidizing solution, such as aqueous solution of sodium chlorite, to oxidize the copper surface to form a surface with needle-shaped copper oxide. It is advantageous for the sequent substrate attaching.

Figure 5:
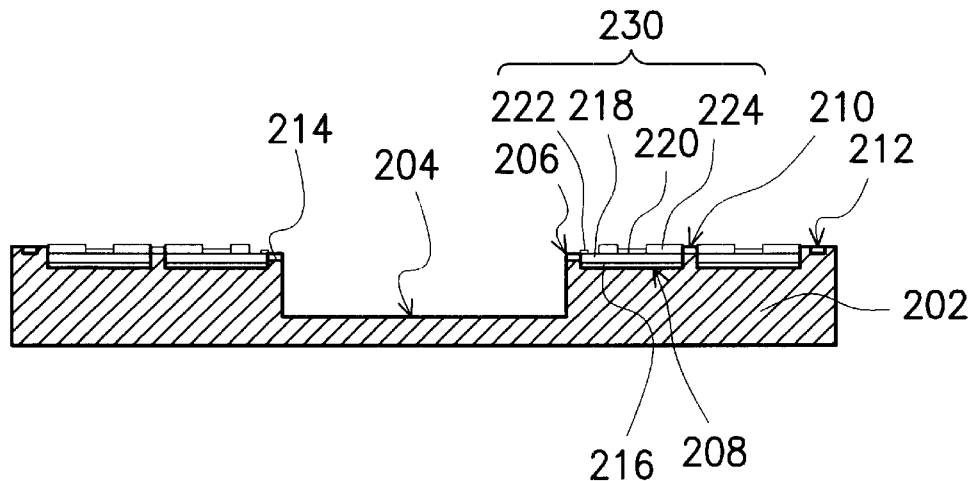
Figure 8:
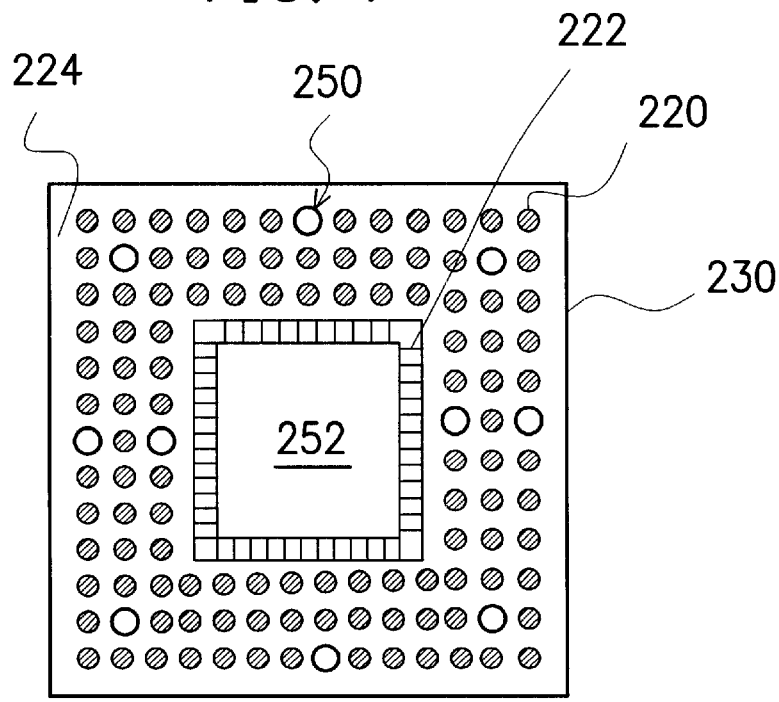
FIG. 8 is a top view of the substrate 230 in FIG. 5.
Figure 9:
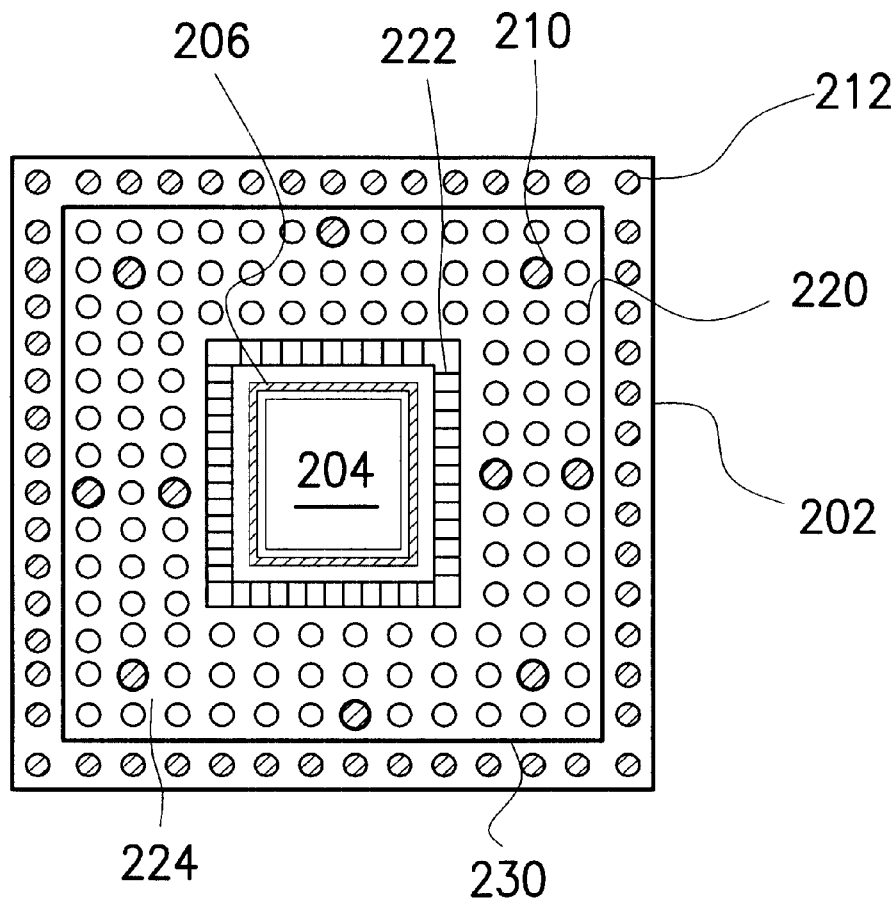
FIG. 9 is a top view of FIG. 5

Referring to FIG. 5, a substrate 230 is attached to the substrate-supporting surface 208. Further, FIG. 8 and FIG. 9 depict a schematically top view of FIG. 5, wherein a top view of only the substrate 230 in FIG. 5 is shown in FIG. 8, and a schematically top view of FIG. 5 is shown in FIG. 9. Therefore the detailed description of a preferred embodiment of the present invention will now be described in referring to, and in conjunction with FIGS. 5, 8 and 9 together hereinafter. The substrate 230 is a laminated board, including a rigid substrate or a flex tape interconnect substrate. The rigid substrate is formed by laminating an insulating layer and a patterned trace layer. The insulating layer is formed such as glass epoxy resin (FR-4, FR-5), bismaleimide-triazie (BT) or epoxy resin. The patterned trace layer is formed by such as photolithographing a copper layer. The flex tape interconnect substrate is consisted of a tape and a patterned trace layer. The tape is formed of such as polyimide. The substrate 230 shown is bonded to the substrate-supporting surface 208 with adhesive 216. A ball pad 220 and a mounting pad (or gold finger) 222 is formed on the top surface of the patterned trace layer of the laminated board 218 in the substrate 230. A solder mask 224 is provided on the surface of the patterned trace layer to expose only the surfaces of the ball pad 220 and the mounting pad 222. The ball pad 220 is used to mount the solder ball. The mounting pad serves as the joint where the substrate 230 is bonded to the die. The substrate 230 has a plurality of through holes 250 in which the ground pad 210 is positioned correspondingly when the ground pad 210 is attached to the substrate 230. In the sequent die attaching, wire bonding, and ball mounting processes, the cavity 204, the ground ring 206, the supporting surface 208, the ground pad 210 or 212 has the corresponding thickness. The cavity 204 has the depth sufficient to accommodate the die. The ground ring 206 needs the mounting pad 222 lower than substrate 230 for wire bonding. To meet the requirement of coplanarity of the solder balls in the sequent solder ball-mounting process, the surfaces of the ground pads 210 and 212 after plating should be roughly coplanar with the surface of the ball pad 220 in the substrate 230. The ground pads 210 and 212 and the substrate 230 are formed in the form of ball grid array.

It would be noted that the ground pads 210 and 212 are the joints where the metal heat spreader 212 is grounded for optional arrangement. For instance, in the consideration of processability, the ground pad 210 can be omitted in attaching substrate 230. In such case, the periphery of ground pad 212 is grounded. The substrate 230 doesn't need to be processed to form through holes 250 therein. Instead, the substrate 230 is attached directly on the substrate-supporting surface 208, without complicated alignment. The ground pad 210 is designed to improve the circuit characters of the substrate 230, if the electric isolation between the circuit characters of the substrate 230 is existed. Therefore, according to the demand of the product, a ground pad 210 or 212 is optionally selected, or both ground pads 210 and 212 are provided.

Figure 6:
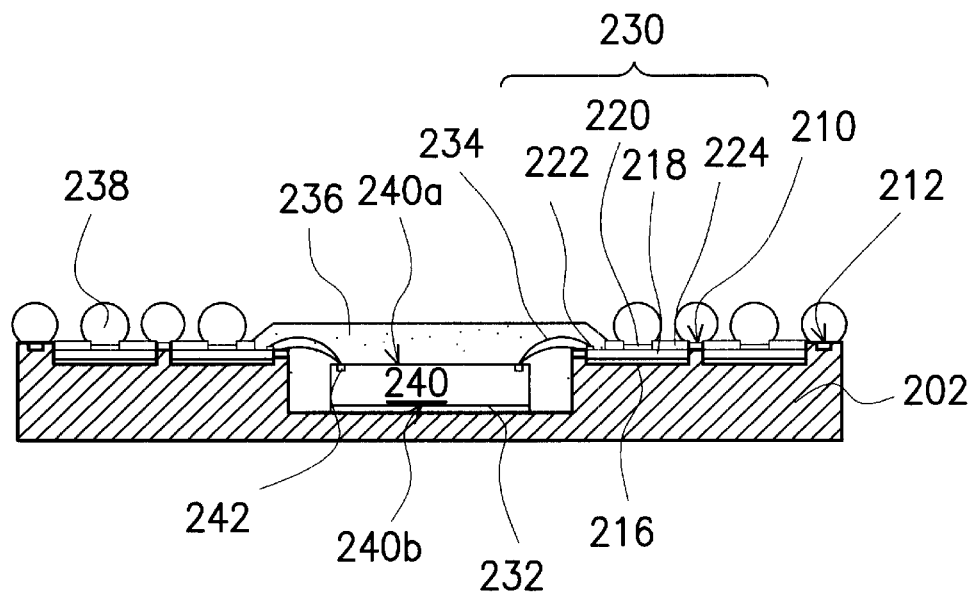

Referring to FIG. 6, a die attaching, wiring bonding, encapsulating and mounting processes are carried out in sequence. The die 240 has an active surface 240a and a correspondingly back surface 204b. The die 240 is attached to the bottom of the cavity 204 by applying the adhesive 232 on the back surface thereof. The wiring process is then performed by using leads 234, Such as gold wire or aluminum wire to electrically connect the ball pad 242 of the active surface 240a to the ground ring 206 and the mounting pad 222. Subsequently, the encapsulating process is carried out. The die 240, leads 234, the ground ring 206 and the mounting pad 222 are encapsulated with the molding compound 236. Thereafter, the mounting process is performed. Solder balls 238 are mounted on the surfaces of the ground pads 210 and 212 and the ball pad 220 in the substrate 230, respectively. The solder balls are formed of such as tin lead alloy. In this case, the metal heat spreader 202 is directly connected to the ground circuit of the printed circuit board by the ground pads 210 and 212 and the solder ball 238 thereon.

As set forth above, the present invention has the advantages as following:

1. A ground pad is directly provided on the heat spreader and solder balls are mounted to ensure the reliability of the joints where the heat spreader is grounded.
2. A cavity, ground pad and substrate-supporting surface are simultaneously formed by thickness decreasing process to simplify the fabricating process. Further, it also can ensure the coplanarity of solder balls to enhance the reliability of the product by thickness controlling to make the ground pad and the position of the solder balls in the substrate stand at the same level.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A heat-spread substrate, comprising:
    a metal heat spreader having a surface with a cavity, which is adapted for supporting a die, and further having:
        a ground ring arranged at the periphery of the cavity;
        a substrate-supporting surface surrounding the periphery of the ground ring; and
        a plurality of first ground pads and a plurality of second ground pads arranged at the periphery of the substrate-supporting surface, wherein said first and second ground pads and said ground ring are formed directly on the metal heat spreader; and,
    a substrate arranged on the substrate-supporting surface to attach to the metal heat spreader, the substrate further including a plurality of through holes, a plurality of mounting pads and a plurality of ball pads.

2. A heat-spreader substrate according to claim 1, wherein the substrate comprises a rigid laminated board.

3. A heat-spreader substrate according to claim 1, wherein the substrate comprises a flex laminated board.

4. A heat-spreader substrate according to claim 1, wherein the each of the second ground pad is located in the corresponding through hole of the substrate.

5. A heat-spreader substrate according to claim 4, wherein a plating layer is further formed on the ground rings, the first ground pads and the second ground pads, respectively.

6. A heat-spreader substrate according to claim 5, wherein the material used for forming the plating layer is selected from a group consisting of copper, nickel, palladium, silver, and nickel palladium alloy.

7. The heat-spread substrate of claim 1, wherein said metal heat spreader, said ground ring, and said first and second ground pads are made of a single piece of metal material.

8. The heat-spread substrate of claim 1, wherein a surface level of said ball pads is same as the surface level of said first and second ground pads.

9. A structure of heat-spread ball grid array type package, comprising:
    a metal heat spreader having a surface with a cavity, which is adapted for supporting a die, and further having:
        a ground ring arranged at the periphery of the cavity;
        a substrate-supporting surface surrounding the periphery of the ground ring; and
        a plurality of first ground pads and a plurality of second ground pads arranged at the periphery of the substrate-supporting surface, wherein said first and second ground pads and said ground ring are formed directly on the metal heat spreader; and
    a substrate arranged on the substrate-supporting surface to attach to the metal heat spreader, the substrate further including a plurality of mounting pads and a plurality of ball pads, wherein a surface level of said ball pads is same as the surface level of said first and second ground pads;
    a die having an active surface and a corresponding back surface, the active surface having electrically connected to said ball pads, and the die is attached to the bottom of the cavity by the back surface thereof;
    a plurality of leads which electrically connected to the ball pads, the ground ring, the ball pads and the mounting pads, respectively;
    a molding compound by which the die, the leads, the ground ring and the mounting pads are encapsulated; and,
    a plurality of solder balls provided on the surfaces of the ball pads and the first ground pads.

10. A structure of heat-spread ball grid array type package according to claim 9, wherein the substrate comprises a rigid laminated board.

11. A structure of heat-spread ball grid array type package according to claim 9, wherein the substrate comprises a flex laminated board.

12. A heat-spreader substrate according to claim 9, wherein the each of the second ground pad is located in the corresponding through hole of the substrate, and the solder balls also being provided on the surfaces of the second ground pads.

13. A structure of heat-spread ball grid array type package according to claim 12, wherein a plating layer is formed on the ground rings, the first ground pads and the second ground pads, respectively.

14. A structure of heat-spread ball grid array type package according to claim 13, wherein the material used for forming the plating layer is selected from a group consisting of copper, nickel palladium, silver, and nickel palladium alloy.

15. A heat-spread substrate, comprising:
    a metal heat spreader having a surface with a cavity, which is adapted for supporting a die, and further having:

a ground ring arranged at the periphery of the cavity;

a substrate-supporting surface surrounding the periphery of the ground ring; and a plurality of ground pads arranged at the periphery of the ground ring, wherein said ground pads and said ground ring are formed directly on the metal heat spreader; and, a substrate arranged on the substrate-supporting surface to attach to the metal heat spreader, the substrate further including a plurality of mounting pads and a plurality of ball pads.

16. A heat-spread substrate according to claim 15, wherein a plating layer is further provided on the surfaces of the ground rings and the ground pads, and the material used for forming the plating layer is selected from a group consisting of copper, nickel, palladium, silver, and nickel palladium alloy.

17. The heat-spread substrate of claim 15, wherein said metal heat spreader, said ground ring, and said ground pads are made of a single piece of metal material.

18. The heat-spread substrate of claim 15, wherein a surface level of said ball pads is same as the surface level of said ground pads.

* * * * *